United States Patent [19]

Higuchi et al.

[11] 4,167,415
[45] Sep. 11, 1979

[54] PHOTOCURABLE COMPOSITION COMPRISING COPOLYMER OF MALEIC ACID MONOESTER AND α-OLEFIN COMPOUND

[75] Inventors: Tetsuo Higuchi; Hiroyuki Nakayama, both of Hiratsuka, Japan

[73] Assignee: Kansai Paint Co., Ltd., Japan

[21] Appl. No.: 858,804

[22] Filed: Dec. 8, 1977

Related U.S. Application Data

[63] Continuation of Ser. No. 646,155, Jan. 2, 1976, abandoned.

[30] Foreign Application Priority Data

Jul. 11, 1975 [JP] Japan .................. 50-85033

[51] Int. Cl.² .................. G03C 1/68; G03C 5/00
[52] U.S. Cl. .................. 96/115 R; 96/35.1; 204/159.15; 204/159.16
[58] Field of Search .......... 96/115 R, 115 P, 33, 96/35.1; 204/159.14, 159.15, 159.16; 260/89.3

[56] References Cited

U.S. PATENT DOCUMENTS

| 3,658,531 | 4/1972 | Kurtz ................. | 96/115 R |
| 3,674,745 | 7/1972 | Phlipot et al. ........ | 96/115 R |
| 3,695,877 | 10/1972 | Taneda et al. ........ | 96/35.1 |
| 3,782,961 | 1/1974 | Takahashi et al. ..... | 96/115 R |
| 3,825,430 | 7/1974 | Kurka ................. | 96/115 R |
| 3,854,946 | 12/1974 | Sayiga ................ | 96/115 R |
| 3,864,133 | 2/1975 | Hizamatsu et al. ..... | 96/115 R |
| 3,928,299 | 12/1975 | Rosenkranz et al. .... | 96/33 |
| 3,948,665 | 4/1976 | Richter et al. ....... | 96/115 R |
| 3,951,657 | 4/1976 | Recchia et al. ....... | 96/33 |
| 4,023,973 | 5/1977 | Imaizumi et al. ...... | 96/115 R |

Primary Examiner—Edward C. Kimlin
Attorney, Agent, or Firm—Ostrolenk, Faber, Gerb & Soffen

[57] ABSTRACT

A photocurable composition comprising a copolymer of maleic acid monoester with α-olefine compound, a polymerizable ethylenically unsaturated compound having a number average molecular weight of less than 3,000 and a boiling point of more than 100° C. at a normal pressure, and a photosensitizer.

7 Claims, No Drawings

PHOTOCURABLE COMPOSITION COMPRISING COPOLYMER OF MALEIC ACID MONOESTER AND α-OLEFIN COMPOUND

This is a continuation of application Ser. No. 646,155, filed Jan. 2, 1976, now abandoned.

BACKGROUND OF THE INVENTION

This invention relates to a photocurable composition and, more particularly, to a photocurable composition which is especially suitable for forming printing plates.

As a photocurable composition for forming printing plates in the conventional art, there has been, for example, proposed and disclosed in the Japanese Pat. No. 265 544 a photocurable composition comprising a high molecular material, a polymerizable ethylenically unsaturated compound and a photosensitizer which is applied or molded onto substrate to obtain a relief image forming layer of solid state at room temperature. Said relief image forming layer is cured by the application of actinic rays and then the un-cured portion is washed away with aqueous alkali solution to obtain the desired printing plate.

Although said high molecular materials such as cellulose derivatives having oxyacid groups, acrylic polymer having oxyacid group and acidic polyvinyl alcohol have two characteristics that make it possible to keep the photocurable composition at solid state at room temperature and that can allow the un-cured photocurable composition to wash away by using an aqueous alkali solution, they are poor in compatibility with the polymerizable ethylenically unsaturated compound and reduce the photopolymerization velocity at the time of forming printing plate. Further, the printing plate obtained is inferior in respect of several properties such as toughness, flexibility, stiffness, abrasion resistance and water resistance.

BRIEF SUMMARY OF THE INVENTION

In order to eliminate the above-mentioned disadvantages in the conventional art, the inventors of the present invention have carried out eager and extensive studies on a photocurable composition which is cured by the application of actinic rays and can be developed by organic solvent or aqueous alkaline solution.

It is therefore an object of the present invention to provide a photocurable composition which is of solid state at room temperature and is curable by the application of actinic rays and can be developed by organic solvent or aqueous alkali solution.

It is further object of the present invention to provide a photocurable composition having excellent photocurability that curing reaction is not inhibited by atmospheric oxygen.

It is still further object of the present invention to provide a photocurable composition which is excellent in mechanical properties such as toughness, flexibility, stiffness and abrasion resistance.

It is further another object of the present invention to provide a photocurable composition which is excellent in compatibility, adhesion, solvent resistance and water resistance.

According to the present invention, there is provided a photocurable composition which comprises a copolymer of maleic acid monoester with α-olefin compound, a polymerizable ethylenically unsaturated compound having a number average molecular weight of less than 3,000 and a boiling point of more than 100° C. at a normal pressure, and a photosensitizer.

DETAILED DESCRIPTION OF THE INVENTION

The copolymer of maleic acid monoester with α-olefine compound (hereinafter referred to as "α-olefine copolymer") used in the present invention is represented by the following formula:

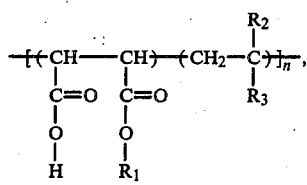

wherein $R_1$ is an alkyl group having 1 to 8 carbon atoms, allyl group, aralkyl group, cyclo group and cycloalkyl group, $R_2$ is a hydrogen or alkyl group of 1 to 3 carbon atoms, $R_3$ is a hydrogen or alkyl group of 1 to 6 carbon atoms and n is an ingeger which makes a number average molecular weight of about 40,000 to about 200,000. Preferable examples of $R_1$ are methyl, ethyl, n-butyl, n-hexyl, allyl, cyclohexyl and tetrahydrofurfuryl group. The α-olefine compounds are those having straight chain or branched chain structure of 2 to 8, preferably, 2 to 6 carbon atoms. Examples thereof are ethylene, propylene, n-butene, isobutylene, n-pentene, isoprene, 2-methyl 1-butene, n-hexene, 2-methyl 1-pentene, 3-methyl 1-pentene, 4-methyl 1-pentene, 2-ethyl 1-butene and the like. Of these, isobutylene is especially preferred.

In order to obtain the α-olefine copolymer, a copolymer of maleic anhydride with 60-olefine compound should be coexisted with alcohol having the above-mentioned $R_1$ group in greater amount than that of the copolymer, followed by half-esterification reaction. If necessary, there may be added one or more conventional esterification catalyst such as pyridine, picoline, tertiary amines (for example triethylamine), P-toluenesulfonic acid, sulfuric acid and the like.

In addition to this, there may be used a method that copolymerization reaction of maleic acid monoester with α-olefine compound is carried out. The alcohols having $R_1$ group should be suitably chosen in consideration of second order transition point and compatibility with the ethylenically unsaturated compound and organic solvent of the α-olefine copolymer obtained.

The α-olefine copolymer produced from any of the above-mentioned methods has a number average molecular weight of about 40,000 to about 200,000 and may be used in the present invention as it is. However, the molecular weight of the α-olefine copolymer should preferably be from 55,000 to 170,000. If the molecular weight of the α-olefine copolymer becomes less than 40,000, the photocurable composition cannot be kept at solid state at room temperature. On the other hand, with the α-olefine copolymer having the molecular weight of more than 200,000, the viscosity of the α-olefine copolymer is increased so that hindrance will be caused during the preparation of solid photosensitive layer on substrate. The amount of the α-olefine copolymer to be added is generally in the range of 20 to 90% by weight, preferably 30 to 80% by weight, of the composition excepting the photosensitizer. When the amount is less than 20% by weight, the property keeping the photocurable composition at solid state at room temperature deteriorates and also it becomes difficult to wash out the photocurable composition with aqueous alkaline solution. On the other hand, when the amount to be added is more than 90% by weight, the curing property of the composition is reduced because the content of the polymerizable ethylenically unsaturated compound described hereinafter is decreased, so that the curing by irradiation with actinic rays takes longer time and the printing plate obtained becomes brittle.

The polymerizable ethylenically unsaturated compounds used for obtaining the photocurable composition of the present invention include, for example, aromatic vinyl monomers such as styrene, vinyltoluene and divinylbenzene; acrylic or methacrylic esters such as methyl (meth)acrylate, ethyl (meth)acrylate, isopropyl (meth)acrylate, n-butyl (meth)acrylate, isobutyl (meth)acrylate, 2-ethylhexyl (meth)acrylate, 2-hydroxyethyl meth(acrylate), glycidyl (meth)acrylate, ethylene glycol di(meth)acrylate, diethylene glycol di(meth)acrylate, glycerol di(meth)acrylate, glycerol tri(meth)acrylate, 1,3-propylene di(meth)acrylate, 1,2,4-butanetriol tri(meth)acrylate, 1,4-cyclohexanediol di(meth)acrylate, 1,4-benzenediol di(meth)acrylate, pentaerythritol tetra(meth)acrylate, 1,5-pentanediol di(meth)acrylate, di(meth)acrylate of polyethlene glycol having a molecular weight of 200 to 2,000 and di(meth)acrylate of polypropylene glycol having a molecular weight of 200 to 2,000; acrylic or methacrylic amide such as N($\beta$-hydroxyethyl) (meth)acrylamide, N,N-bis($\beta$-hydroxyethyl) (meth) acrylamide, diacetone (meth)acrylamide, methylene bis(meth)acrylamide, ethylene bis(meth)acylamide, 1,6-hexamethylene bis(meth)acrylamide, diethylenetriamine tris(meth)acrylamide, bis($\gamma$-(meth)acrylamide propoxy) ethane and $\beta$-(meth)acrylamide ethylacrylate; reaction products of polyepoxy compounds with compounds having active hydrogen and ethylenically unsaturated double bond such as reaction product of 2 moles of acrylic acid with 1 mole of Epikote 828 (trade mark for epoxy resin produced by Shell Chemical Co.) and unsaturated polyesters such as maleic acid or fumaric acid type unsaturated polyester in styrene or (meth)acrylamide and itaconic acid type unsaturated polyester in styrene, (meth)acrylamides or (meth)acrylic esters.

They may be used alone or in admixture with one another in consideration of compatibility with $\alpha$-olefine copolymer and physical properties such as flexibility and stiffness of the printing plate obtained.

The amount of the polymerizable ethylenically unsaturated compound to be used is inevitably in the range of 10 to 80% by weight, preferably 20 to 70% by weight of the photocurable composition excepting the photosensitizer. The use of less than 10% by weight cause decrease of photocurability which is not effective for forming the printing plate. When the amount is more than 80% by weight, it is impossible to maintain the photocurable composition in solid state at room temperature and also it becomes difficult to wash out the composition with aqueous alkaline solution.

Then, the photosensitizer as indicated hereinafter is added to the photocurable composition to complete the present invention. The amount of the photosensitizer is generally in the range of 0.01 to 5% by weight, preferably 0.1 to 2% by weight, of the composition. Examples of the photosensitizer useful in the present invention include: $\alpha$-carbonyl alcohols such as benzoin, butyroin, trioin, acetoin, acroin and the like; acyloin ethers such as benzoin methyl ether, benzoin ethyl ether, benzoin isopropyl ether, pivaloin ethyl ether, anisoin ethyl ether, and the like; $\alpha$-substituted acyloin such as $\alpha$-methylbenzoin, $\alpha$-phenylbenzoin and the like; polynuclear quinones such as 9,10-anthraquinone, 2-chloroanthraquinone, 2-methylanthraquinone, 1,4-naphthoquinone, 2,3-benzanthraquinone, and the like; nighboring polyketone compounds such as diacetyl, dibenzoyl, diphenyltriketone, phenylglyoxal, pentanedion-2,3 and the like; mercaptans such as 2-mercaptobenzothiazole, 2-mercaptobenzooxazole, 2-mercaptonaphthooxazole, 2-mercaptobenzoimidazole and the like; disulfides such as diphenyl disulfide; dibenzyl disulfide, di-n-butyl disulfide, dibenzoyl disulfide, diacetyl disulfide, dibornyl disulfide and the like; thiols such as thiophenol, o-aminothiophenol and the like; thiuram derivatives such as tetramethylthiuram monosulfide, tetramethylthiuram disulfide, tetramethylthiuram tetrasulfide and the like; metal complexes such as acetylacetone nickel complex and the like; peroxides such as benzoyl peroxide, di-tert-butyl peroxide and the like; phenylketones such as benzophenone, Michler's ketone $\omega$-bromoacetophenone and the like; aromatic sulfonyl chlorides such as 1-naphthalene-sulfonyl chloride and the like; and metal mercaptides such as mercury phenylmercaptide and the like.

Of the photosensitizers defined, the $\alpha$-carbonyl alcohols, $\alpha$-substituted acyloins and acyloin ethers are most suitable since the same are excellent in solubility in the photocurable composition.

Further, to the photocurable composition of the invention other additives such as pigments, dyes and fillers may be added and dispersed as long as they do not decrease the photocurability of the composition too much. Also, a radical polymerization inhibitor may be added to the photocurable composition in order to avoid gellation by thermal polymerization in an amount of 0.001 to 1% by weight based on the photocurable composition. Examples of the radical polymerization inhibitor are hydroquinone, hydroquinone monomethyl ether, p-benzoquinone, 3,5-ditertiary-butylhydroxytoluene (hereinafter referred to as "BHT"), 2,2'-dimethyl-5,5'-ditertiary-butyl-4,4'-dihydroxyphenylthio ether, p-methoxyphenol, tert-butylcatechol, $\beta$-naphthol, pyrogallol, nitrobenzene, N-nitroso N-phenylhydroxyamine(cupferron), and metal salts thereof, nitroso compounds such as N-nitroso-di-phenyl amine, or the like.

The photocurable composition of the present invention is very suitable for use in a seal, a photoresist for etching or an ornamental molding material in addition to a printing plate, and can be completely cured by irradiation of even a small quantity of actinic rays. The resultant cured product is extremely excellent in mechanical strengths and water and chemical resistance. Further, the photocurable composition of the invention may be completely cured without treating it under anaerobic conditions. The actinic rays are those having a wavelength of 200 m$\mu$ to 800 m$\mu$. Almost any light sources may be used without limitation, including a low pressure mercury lamp, a high pressure mercury lamp, a carbon arc lamp, a xenone lamp, a tungsten lamp, a fluorescent lamp for chemical purpose, sun light, laser light, and the like, by which the photocurable composition applied can be completely cured by irradiation for 0.1–100 minutes in general cases. When used as an image-forming layer, the composition of the invention is generally molded into a 0.01–100 mm thick layer in solid form, which is then exposed to light through an image pattern by the use of any of the above-mentioned light sources for selectively curing the image areas. Non-exposed or non-cured areas are generally dissolved out by organic solvent or alkali aqueous solution. A surface active agent aqueous solution or other developing means may be also employed. As the alkali aqueous solutions, there are, for example, aqueous ammonia, alkali metal hydroxide aqueous solutions, aqueous solutions of alkali metal salts such as carbonates, bicarbonates and acetates, aqueous solutions of organic amines such as ethanolamine, diethanolamine and triethanolamine. These alkali aqueous solutions are used in concentration of 0.01 to 10% by weight, conventionally less than 5% by weight. As the organic solvent, there are for example, methanol and ethanol.

The present invention will be particularly illustrated by way of the following examples, which should not be construed as limiting thereto the present invention.

EXAMPLE 1

To a 5 liter three neck flask with a stirrer, a reflux condenser and a thermometer were added 900g of copolymer of maleic anhydride with isobutylene having a number average molecular weight of $5.5-6.5\times10^4$ (a product of Kuraray Co., Ltd., Japan, which is commercially available as trade name "ISOBAM-04") and 2,100 g of butanol. Then, the contents were heated to cause half-esterification at 180° C. Thus, after 9 hours, a half-esterified product (hereinafter referred to as "α-olefine copolymer I") of the copolymer "ISOBAM-04" was prepared. The resultant α-olefine copolymer I was washed five times with n-hexane solution and then dried for 40 hours in vacuum desiccator heated to 100° C. The degree of ring-opening reaction was 97%, which was measured by acid value.

In the next step, 65g of the dried α-olefine copolymer I, 35g of triethylene glycol dimethacrylate, 1g of benzoin methyl ether and 0.01g of p-methoxy phenol were dissolved into 70g of acetone to obtain a photocurable composition.

This photocurable composition was applied to primer-coated metal plate of 0.3 mm thickness by means of an applicator and kept in a dark place for 72 hours at a room temperature to remove the solvent. Thus, a photosensitive plate having a film thickness of 0.6 mm was obtained by press molding of the photocurable composition.

Then, a negative film was closely contacted to the above photosensitive plate, and the photosensitive plate was irradiated for 15 minutes by means of a low pressure mercury lamp (Model FL-20BL produced by Tokyo Shibaura Electric Co., Ltd.) located at a distance of 12 cm from the plate and developed for 3 minutes with a 0.3% sodium hydroxide aqueous solution (solution temperature: 20° C.), followed by post-irradiation for 2 minutes to obtain a relief printing plate which was excellent in reproducibility and printing durability (ensuring 500,000 or more printing pass operation).

Also this relief printing plate was rolling-pressed onto a wet paper matrix to obtain a pattern plate with excellent reproducibility and sharpness. The production of at least 20 pattern plates was possible without any change of the reproducibility since the relief printing plate had excellent hardness (about 85 degrees at 23° C. by the scale of the Shore hardness tester specified by ASTM D-2240-68) and water resistance.

EXAMPLE 2

Into 70 g of acetone were dissolved 60 g of the α-olefine copolymer I obtained in Example 1, 40 g of dimethacrylate of polyethylene glycol having a molecular weight of 1,000, 1 g of benzoin ethyl ether and 0.01 g of hydroquinone to obtain a photocurable composition.

This photocurable composition was applied to a primer-coated polyester sheet of 0.25 mm thickness by means of an applicator and kept in a dark place for 72 hours at a room temperature to remove the solvent. Thus, a photosensitive plate having a film thickness of 0.6 mm was obtained by press molding of the photocurable composition.

Then, a negative film was closely contacted to the above photosensitive plate, and the photosensitive plate was irradiated for 15 minutes by means of a low pressure mercury lamp used in Example 1 located at a distance of 12 cm from the plate and developed for 3 minutes with a 0.3% sodium hydroxide aqueous solution, followed by postirradiation for 2 minutes to obtain a relief printing plate which was excellent in reproducibility and printing durability (ensuring 500,000 or more printing pass operation).

EXAMPLE 3

The photocurable composition obtained in Example 2 was applied to a silk screen by immersion method and dried in a dark place for 24 hours at a room temperature to obtain a photosensitive material for silk screen.

Then, a negative film was closely contacted to the above photosensitive material, which was irradiated for 5 minutes by means of a low pressure lamp used in Example 1 and developed for 30 seconds with a 0.3% sodium hydroxide aqueous solution to obtain a silk screen printing plate which was excellent in reproducibility and flexibility.

EXAMPLE 4

Into 90 g of acetone were dissolved 90 g of the α-olefine copolymer I obtained in Example 1, 10 g of triacrylate of triethylene glycol, 1 g of benzoin methyl ether and 0.01 g of hydroquinone monomethyl ether to obtain a photocurable composition.

Then, a relief printing plate was prepared in the same procedure as in Example 1. However, the resultant printing plate was poor in sharpness and further main irradiation for 40 minutes was required to obtain a sharp relief image.

EXAMPLE 5

Into 50 g of acetone were dissolved 20 g of the α-olefine copolymer I obtained in Example 1, 80 g of triacrylate of triethylene glycol, 1 g of benzoin methyl ether and 0.01 g of hydroquinone monomethyl ether to obtain a photocurable composition.

Then, a relief printing plate was prepared in the same procedure as in Example 1. However, the resultant printing plate was semi-solid and un-cured portion was not almost washed out. In order to wash out the uncured portion completely, further developing for 30 minutes was required.

EXAMPLE 6

To an autoclave were added 300 g of copolymer of maleic anhydride with isobutylene having a number average molecular weight of $8-9\times10^4$ (a product of Kuraray Co., Ltd., Japan, which is commercially available as trade name "ISOBAM-06"), 700 g of ethanol and 0.5 g of p-toluenesulfonic acid. Then, the contents were heated to cause half-esterification at 130° C. Thus, after 7 hours, a half-esterified product (hereinafter referred to as "α-olefine copolymer II") of the copolymer "ISOBAM-06" was prepared. The resultant α-olefine copolymer II was washed five times with n-hexane solution and then dried for 20 hours in vacuum desiccator heated at 100° C. The degree of ring-opening reaction was 99%, which was measured by acid value.

A mixture of 60 g of the α-olefine copolymer II, 20 g of dimethacrylate of diethylene glycol, 20 g of dimethacrylate of polyethylene glycol having a molecular weight of about 400, 1 g of benzoin isopropyl ether and 0.1 g of N-nitrosodiphenylamine was uniformly kneaded for 30 minutes by means of a pair of hot rolls each having a surface temperature of 130° C. to obtain a photocurable composition. This composition was press molded on a primer-coated metal plate of 0.3 mm thickness in such a manner that a photosensitive layer was formed in a thickness of 0.6 mm to obtain a photosensitive sheet.

Then, a relief printing plate was prepared in the same procedure as in Example 1. The resultant relief printing plate was excellent in reproducibility and printing durability (ensuring 500,000 or more printing pass operatiion).

EXAMPLE 7

Into a mixture solvent of 7 g of dioxane and 7 g of ethyl alcohol were dissolved 5 g of the α-olefine copolymer II, 4 g of triacrylate of trimethylol propane, 1 g of methylene bisacrylamide, 0.1 g of benzoin ethyl ether and 0.001 g of 3,5-di-(tert-butyl)-hydroxy toluene to obtain a photocurable composition.

This composition was applied to a grained aluminum plate by means of an application and kept in a dark place for 24 hours at a room temperature to remove the solvent. Thus, a photosensitive plate for lithography having a film thickness of 20μ was obtained.

Then, a negative film was closely contacted to the above photosensitive plate, which was irradiated for 2 minutes and developed for 20 seconds in the same procedure as in Example 1 to obtain a printing plate for lithography which was excellent in reproducibility and printing durability.

What is claimed is:

1. A photocurable composition especially adapted for the formation of printing plates which consist essentially of (A) a mixture of 20 to 90% by weight of a maleic acid/isobutylene copolymer of the formula:

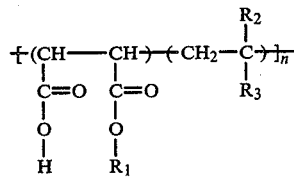

wherein $R_1$ is an alkyl group having 1 to 8 carbon atoms, aralkyl group, or cycloalkyl group, $R_2$ is methyl, $R_3$ is methyl and n is an integer which provides a number average molecular weight of 80,000 to 170,000 and 10 to 80% by weight of a polymerizible ethylenically unsaturated compound having a number average molecular weight of less than 3,000 and a boiling point of more than 100° C. at normal pressure; and (B) 0.01–5% by weight based on the weight of (A) of a photosensitizer.

2. A photocurable composition according to claim 1, wherein said polymerizable ethylenically unsaturated compound is selected from the group consisting of aromatic vinyl monomers, consisting of aromatic vinyl monomers; acrylic or methacrylic esters, reaction products of polyepoxy compounds with compounds having active hydrogen and ethylenically unsaturated double bond, maleic acid or fumaric acid type unsaturated polyester in styrene or (meth)acrylamide, itaconic acid type unsaturated polyester in styrene, (meth)acrylamides and (meth)acrylic esters.

3. A photocurable composition according to claim 1, wherein said photosensitizer is selected from the group consisting of α-carbonyl alcohols consisting of benzoin, butyroin, trioin, acetoin and acroin; acyloin ethers consisting of benzoin methyl ether, benzoin ethyl ether, benzoin isopropyl ether, pivaloin ethyl ether, and anisoin ethyl ether; α-substituted acyloins consisting of α-methylbenzoin, and α-phenylbenzoin; polynuclear quinones consisting of 9,10-anthraquinone, 2-chloroanthraquinone, 2-methylanthraquinone, 1,4-naphthoquinone, and 2,3-benzanthraquinone; neighboring polyketone compounds consisting of diacetyl, dibenzoyl, diphenyltriketone, phenylglyoxal, and pentadion-2,3; mercaptans consisting of 2-mercaptobenzothiazole, 2-mercaptobenzooxazole, 2-mercaptonaphthooxazole, and 2-mercaptobenzoimidazole; disulfides consisting of diphenyl disulfide, dibenzyl disulfide, di-n-butyl disulfide, dibenzoyl disulfide, diacetyl disulfide, and dibornyl disulfide; thiols consisting of thiophenol and o-aminothiophenol; thiuram derivatives consisting of tetramethylthiuram monosulfide, tetramethylthiuram disulfide and tetramethylthiuram tetrasulfide; a metal complex consisting of acetylacetone nickel complex; and peroxides consisting of benzyol peroxide and di-tert-butyl peroxide; phenylketones consisting of benzophenone, Michler's ketone and ω-bromoacetophenone; an aromatic sulfonyl chloride consisting of 1-naphthalenesulfonyl chloride; and a metal mercaptide consisting of mercury phenylmercaptide.

4. A photocurable composition according to claim 1, wherein said mixture is of 30 to 80% of said copolymer and 20 to 70% of said unsaturated compound, and wherein the amount of said photosensitizer is 0.1 to 2%.

5. A photocurable composition according to claim 1, wherein said photosensitizer is benzoin methyl ether and wherein said unsaturated compound is selected from the group consisting of triethylene glycol dimethacrylate, dimethacrylate of polyethylene glycol and triacrylate of polyethylene glycol.

6. A photocurable composition according to claim 1, wherein said number average molecular weight is 80,000 to 90,000.

7. A photocurable composition according to claim 1, wherein said unsaturated compound is selected from the group consisting of a mixture of dimethacrylate of diethylene glycol and dimethacrylate of polyethylene glycol and a mixture of triacrylate of trimethylol propane and methylene bisacrylate, wherein said photosensitizer is selected from the group consisting of benzoin isopropyl ether and benzoin ethyl ether.

* * * * *